United States Patent
Shubat et al.

(10) Patent No.: US 6,646,933 B1
(45) Date of Patent: Nov. 11, 2003

(54) METHOD AND APPARATUS TO REDUCE THE AMOUNT OF REDUNDANT MEMORY COLUMN AND FUSES ASSOCIATED WITH A MEMORY DEVICE

(75) Inventors: Alexander Shubat, Fremont, CA (US); Niranjan Behera, Santa Clara, CA (US); Izak Kense, Fremont, CA (US)

(73) Assignee: Virage Logic Corporation, Fremont, CA (US)

( * ) Notice: Subject to any disclaimer, the term of this patent is extended or adjusted under 35 U.S.C. 154(b) by 0 days.

(21) Appl. No.: 10/210,525

(22) Filed: Jul. 31, 2002

(65) Prior Publication Data (65)

Related U.S. Application Data

(62) Division of application No. 09/895,896, filed on Jun. 29, 2001, now Pat. No. 6,519,202.

(51) Int. Cl.[7] .............................. G11C 7/00; G11C 8/00
(52) U.S. Cl. ................ 365/200; 365/225.7; 365/230.02
(58) Field of Search ................ 365/200, 225.7, 365/230.02, 230.03, 189.01, 189.02, 189.05

(56) References Cited

U.S. PATENT DOCUMENTS

| | | | |
|---|---|---|---|
| 4,459,685 A | * | 7/1984 | Sud et al. ............ 365/200 |
| 5,583,463 A | | 12/1996 | Merritt |
| 5,608,678 A | | 3/1997 | Lysinger |
| 5,859,801 A | * | 1/1999 | Poechmueller ........ 365/200 |
| 6,051,031 A | | 4/2000 | Shubat |
| 6,084,463 A | | 7/2000 | Sasaki |
| 6,084,819 A | | 7/2000 | Kablanian |
| 6,091,620 A | | 7/2000 | Kablanian |
| 6,104,663 A | | 8/2000 | Kablanian |
| 6,363,020 B1 | | 3/2002 | Shubat et al. |
| 6,396,760 B1 | | 5/2002 | Behera et al. |

OTHER PUBLICATIONS

Betty Prince, Semiconductor Memories, copyright 1983, pp. 150–303.

* cited by examiner

Primary Examiner—Thong Le
(74) Attorney, Agent, or Firm—Blakely, Sokoloff, Taylor & Zafman LLP

(57) ABSTRACT

A method, system, and apparatus exist which couple a first group of non-redundant memory columns to a non-redundant input-output circuit and couple a second group of redundant memory columns to a redundant input-output circuit. A fewer amount of memory columns exist in the second group of redundant memory columns than in the first of non-redundant memory columns. A first fuse indicates whether one or more memory columns are defective in a group of non-redundant memory columns coupled to the non-redundant input output circuit. Also, a second fuse couples to a first circuit. The first circuit identifies which sub-input circuit is coupled to the one or more defective memory columns.

16 Claims, 12 Drawing Sheets

METHOD AND APPARATUS TO REDUCE THE AMOUNT OF REDUNDANT MEMORY COLUMN AND FUSES ASSOCIATED WITH A MEMORY DEVICE

RELATED APPLICATIONS

This application is a divisional application of U.S. application Ser. No. 09/895,896 filed, Jun. 29, 2001, which issued as U.S. Pat. No. 6,519,202.

FIELD OF THE INVENTION

The present invention relates generally to integrated circuit memory devices, and more specifically to a memory having a column redundancy scheme.

BACKGROUND OF THE INVENTION

Random defects occurring during the manufacturing of an integrated circuit memory device can render non-redundant elements of an integrated circuit memory device, such as a memory column, defective. For example, particle contamination during the manufacturing process may cause broken or shorted out columns and bit defects.

Redundant elements in an integrated circuit memory device, such as redundant columns, are used to compensate for these random defects. Initial testing of an integrated circuit memory occurs after the manufacturing process. During initial testing of an integrated circuit memory device, defective elements are replaced by non-defective elements referred to as redundant elements. Thus, redundant columns may be used in a scheme to replace defective non-redundant columns, discovered during initial testing of the integrated circuit memory device. The use of redundant elements is important in increasing the overall yield of an integrated circuit memory device.

With ever increasing densities and smaller feature sizes in integrated circuit memory devices, cell redundancy has become more and more important to the proper functioning of larger memory devices. Most memories now require column redundancy in which a portion of the memory cell array is designated as a redundant memory section. When a defective portion of the main memory exists, then the memory cells of the redundant memory section are accessed. On-chip logic circuitry is employed to store defective main memory column references consisting of bit number and Y-address information to facilitate writing and reading of data to the redundant memory. This logic circuitry includes multiple fuse groups wherein individual fuses within a fuse group are either open or closed to represent a logic state. Each fuse group forms a logic word corresponding to a defective memory column in the main memory. To enable use of the redundant column, a set of fuses are, generally, cut or blown.

Several problems exist in previous techniques to create redundant memory columns. For example, a problem exists in some previous techniques in that the number of the redundant memory columns needs to match the number, (e.g., 8 columns, 16 columns, or 32 columns) of non-redundant memory columns coupled to each input-output circuit. As such, large scale memory column schemes require more space to implement redundant columns. For example, 32 redundant memory columns occupy approximately four times the space that 8 redundant memory columns occupy. This decreases the physical space remaining on the chip that may be used for packing additional operational components onto the single chip. Reducing the physical space that the redundant memory columns occupy decreases the cost per dice to manufacture the die.

FIGS. 1–4 illustrate previous techniques of various memory devices accompanied by fuse boxes associated with that memory device.

FIG. 1 illustrates a previous technique of having an equal number of memory columns coupled to both the redundant and non-redundant memory columns. The memory device contains a redundant input-output circuit, and non-redundant input-output circuits, such as the first input-output circuit (IO[0]) through the sixth input-output circuit (IO[5]). In this previous technique, the amount of memory columns in the group of non-redundant memory columns coupled to the non-redundant input-output circuit was equal to the amount of memory columns in the group of redundant memory columns coupled to the redundant input-output circuit. For example, non-redundant input-output circuit IO[0] couples to a group of eight non-redundant memory columns. The redundant input-output circuit also couples to eight memory non-redundant memory columns. Note that only one fuse is required per input-output circuit because the number of columns coupled the redundant input output circuit is equal to the number of columns coupled to each non-redundant input-output circuit.

FIG. 2 illustrates a previous technique of having a fuse associated with each sub-input-output circuit contained with an input-output circuit. Each non-redundant input-output circuit, such as IO[0] contains two sub input-output circuits. For example, non-redundant input-output circuit IO[0] contains two sub input-output circuits, sub-IO-0 and sub-IO-1. Non-redundant input-output circuit IO[0] couples through sub-IO-0 and sub-IO-1 to the group of eight non-redundant memory columns. Each sub input-output circuit has a fuse associated with that particular sub input-output circuit to indicate whether one or more memory columns coupled to that sub input-output circuit are defective. For example, the second fuse is blown indicated by the fuse containing a logical 1. The second fuse is blown to indicate one or more memory columns coupled to sub-IO-2 are defective. Thus, in this example, the memory device needs the physical space on a silicon chip for two fuses per input-output circuit because one fuse exists per sub input-output circuit.

FIG. 2 also illustrates a previous technique of a single global input-output select-signal going to every sub input-output in each input-output. The global sub input-output enable signal activates all the sub input-output's contained in a single input-output circuit when a reading or writing operation occurs. For example, the global sub-input-output enable signal is received in both sub-IO-0 and sub-IO-1 contained in input-output circuit IO[0]. The global sub input-output enable signal causes every sub input-output in that particular input-output circuit to activate. When every sub input-output circuit activates each sub input-output circuit consumes power whether or not a data transfer operation is occurring in that particular sub-IO circuit. Reducing power consumption by electronic circuits not in use is a major concern, especially in portable devices powered by a battery.

FIG. 2 also illustrates the previous technique of having an equal number of memory columns coupled to both the redundant and non-redundant memory columns. As noted above, non-redundant input-output circuit IO[0] couples through sub-IO 0 and sub-IO 1 to the group of eight non-redundant memory columns. The redundant input-out circuit also couples its two sub input-output circuits to a group of eight memory non-redundant memory columns.

FIG. 3 illustrates a previous technique of having thirty-two memory columns coupled to the redundant input-output circuit as well as having thirty-two, i.e. an equal number of memory columns, coupled to a non-redundant input-output circuit. Also, it should be noted that if the previous technique of having one fuse for each sub input-output circuit contained in an input-output circuit was implemented, then typically four sub input-output circuits would be contained in each input-output circuit. Thus, the memory device needs the physical space on a silicon chip for four fuses per input-output circuit because one fuse exists per sub input-output circuit.

FIG. 3 illustrates a single global sub input-output enable signal going to each sub input-output circuit. Likewise, if four sub input-output circuits existed per input-output circuit, then the global sub input-output enable signal needlessly activated all four sub input-output circuits when only one sub input-output was actually performing a data transfer operation.

FIGS. 4A-1 and 4A-2 illustrate a single global sub input-output enable signal going to both the sub input-output circuits, sub-IO-0 and sub-IO-1, contained in input-output circuit I0[2]. The global sub input-output enable signal activates both sub input-output circuits when performing data transfer operation, such as a reading operation to a memory column in the group of memory columns coupled to the input-output circuit. The global sub input-output enable signal activates both sub input-output circuits even though only one of the sub-input output circuits will actually be performing the data transfer operation. Thus, both sub input-output circuits will consume power.

SUMMARY OF THE INVENTION

A method, system, and apparatus exist which couple a first group of non-input-output redundant memory columns to a non-redundant input-output circuit and couple a second group of redundant memory columns to a input-output circuit. A fewer amount of memory columns exist in the second group of redundant memory columns than in the first group of non-redundant memory columns. A first fuse indicates whether one or more memory columns are defective in a group of non-redundant memory columns coupled to the non-redundant input output circuit. Also, one or more fuses couple to a first circuit. The first circuit identifies which sub-input-output circuit is coupled to the one or more defective memory columns.

Additional features and advantages of the present invention will be apparent from the accompanying drawings and from the detailed description that follows.

BRIEF DESCRIPTION OF THE DRAWINGS

The drawings refer to embodiments of the invention in which:

FIGS. 4A-1 and 4A-2 illustrate a single global sub input-output enable signal going to both the sub input-output circuits, sub-IO-0 and sub-IO-1, contained in input-output circuit-2;

FIGS. 5A-1 and 5A-2 illustrate a block diagram of an embodiment of a group of thirty-two non-redundant memory columns coupled to a non-redundant input-output circuit and a group of eight memory columns coupled to the redundant input-output circuit;

FIGS. 6A-1 and 6A-2 illustrates a block diagram of an embodiment of a separate sub input-output enable signal to activate each sub input-output contained within the same input-output circuit individual and not globally activate all of the sub input-output's circuits contained within the same input-output circuit;

Figure 1:
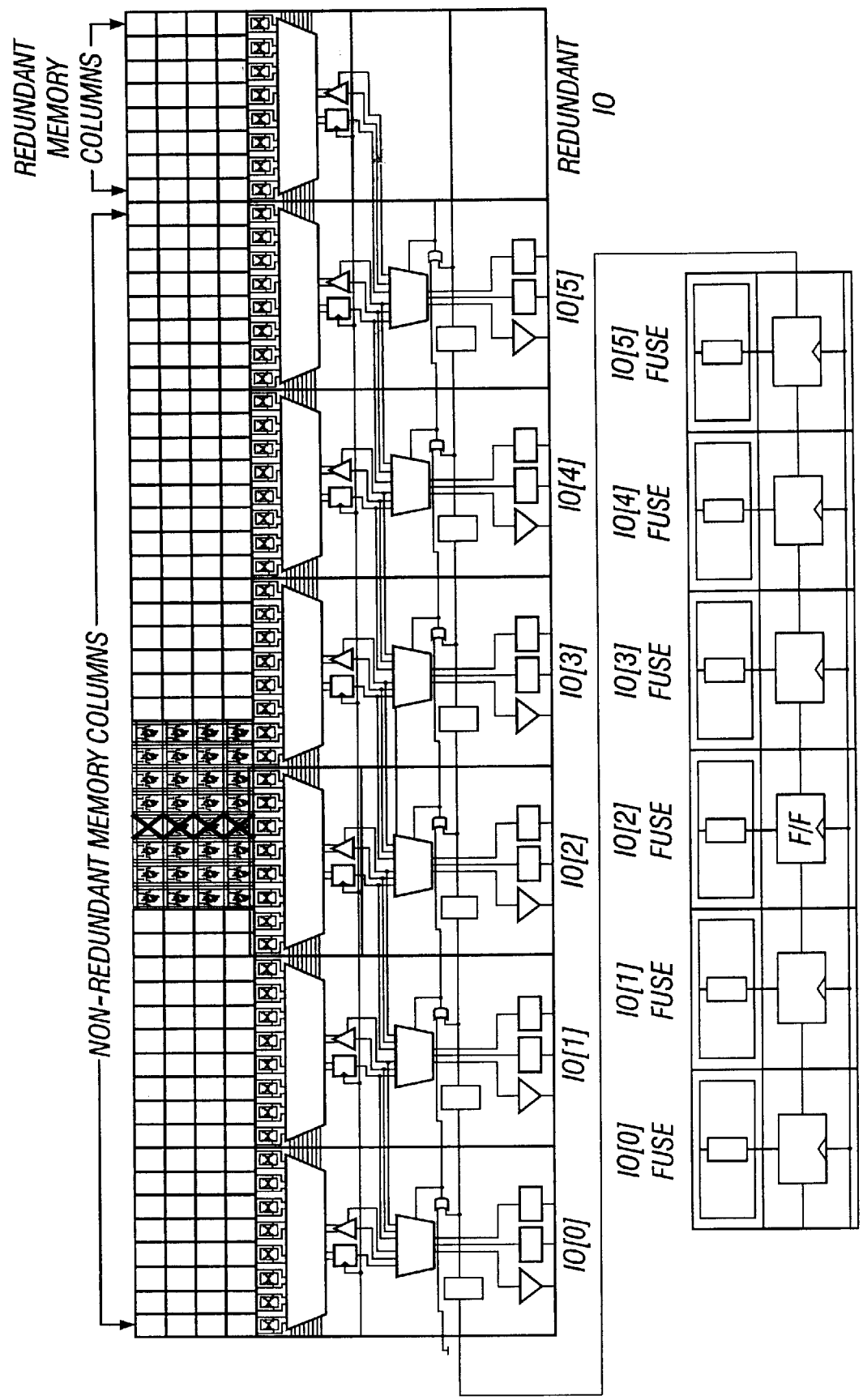
FIG. 1 illustrates a previous technique of having an equal number of memory columns coupled to both the redundant and non-redundant memory columns.

While the invention is subject to various modifications and alternative forms, specific embodiments thereof have been shown by way of example in the drawings and will herein be described in detail. The invention should be understood to not be limited to the particular forms disclosed, but on the contrary, the intention is to cover all modifications, equivalents, and alternatives falling within the spirit and scope of the invention.

DETAILED DISCUSSION

In the following description, numerous specific details are set forth, such as examples of specific data signals, named components, connections, number of memory columns in a group of memory columns, etc., in order to provide a thorough understanding of the present invention. It will be apparent, however, to one skilled in the art that the present invention may be practiced without these specific details. In other instances, well known components or methods have not been described in detail but rather in a block diagram in order to avoid unnecessarily obscuring the present invention. Thus, the specific details set forth are merely exemplary. The specific details may be varied from and still be contemplated to be within the spirit and scope of the present invention. The term coupled is defined as meaning connected either directly or indirectly.

In general, a method, system, and apparatus are described in which a first group of non-redundant memory columns couples to a non-redundant input-output circuit and a second group of redundant memory columns couples to a redundant input-output circuit. A fewer number of memory columns exist in the second group of redundant memory columns than in the first group of non-redundant memory columns.

In general, a method, system, and apparatus are described in which a first fuse couples to a non-redundant input-output circuit. The first fuse indicates whether one or more memory columns are defective in a group of non-redundant memory columns coupled to the non-redundant input-output circuit. Also, a second fuse couples to a first circuit. The first circuit identifies which sub-input-output circuit is coupled to the one or more defective memory columns.

In general, a method, system, and apparatus are described in which a data transfer operation is performed with a first sub input-output circuit in an input-output circuit. The input output circuit contains a plurality of sub input-output circuits that each receives a separate activation signal. The first sub input-output circuit activates individually to perform the data transfer operation without globally activating the plurality of sub input-output circuits contained within the input-output circuit.

Figure 2:
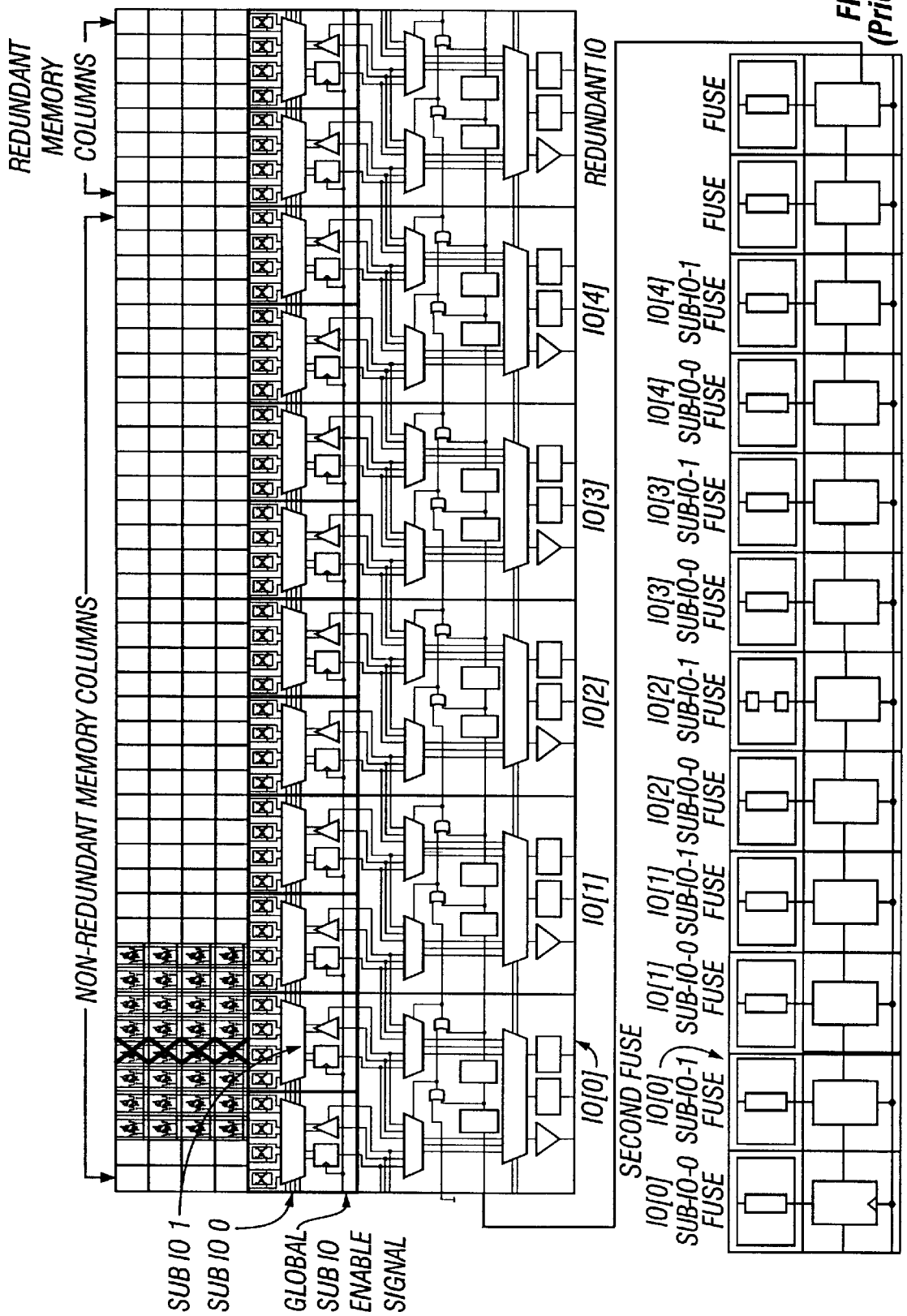
FIG. 2 illustrates a previous technique of having a fuse associated with each sub-input-output circuit contained with an input-output circuit.
Figure 3:
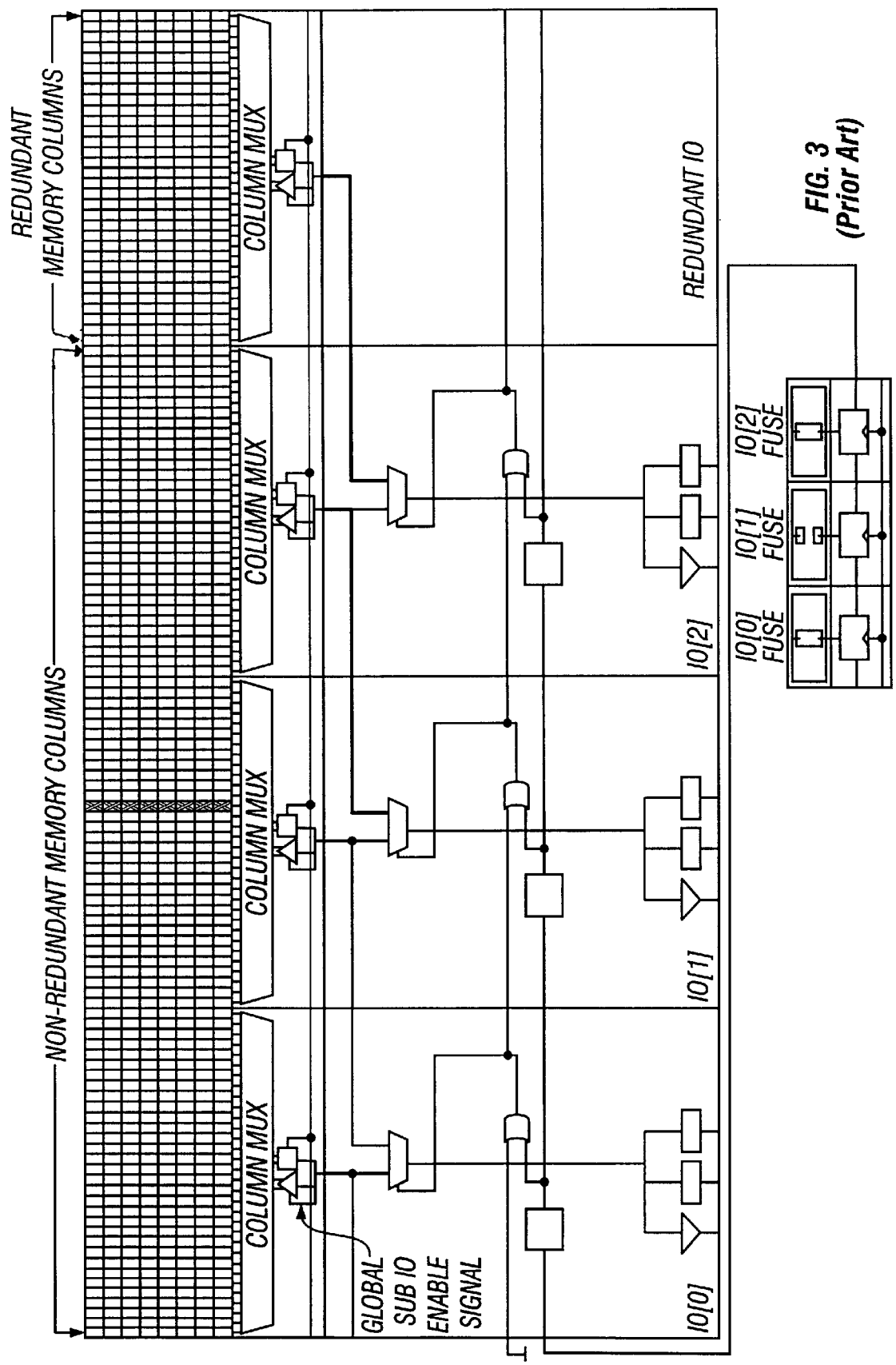
FIG. 3 illustrates a previous technique of having thirty-two memory columns coupled to the redundant input-output circuit as well as having thirtytwo, i.e. an equal number of memory columns, coupled to a non-redundant input-output circuit.
Figures 1, 4A:
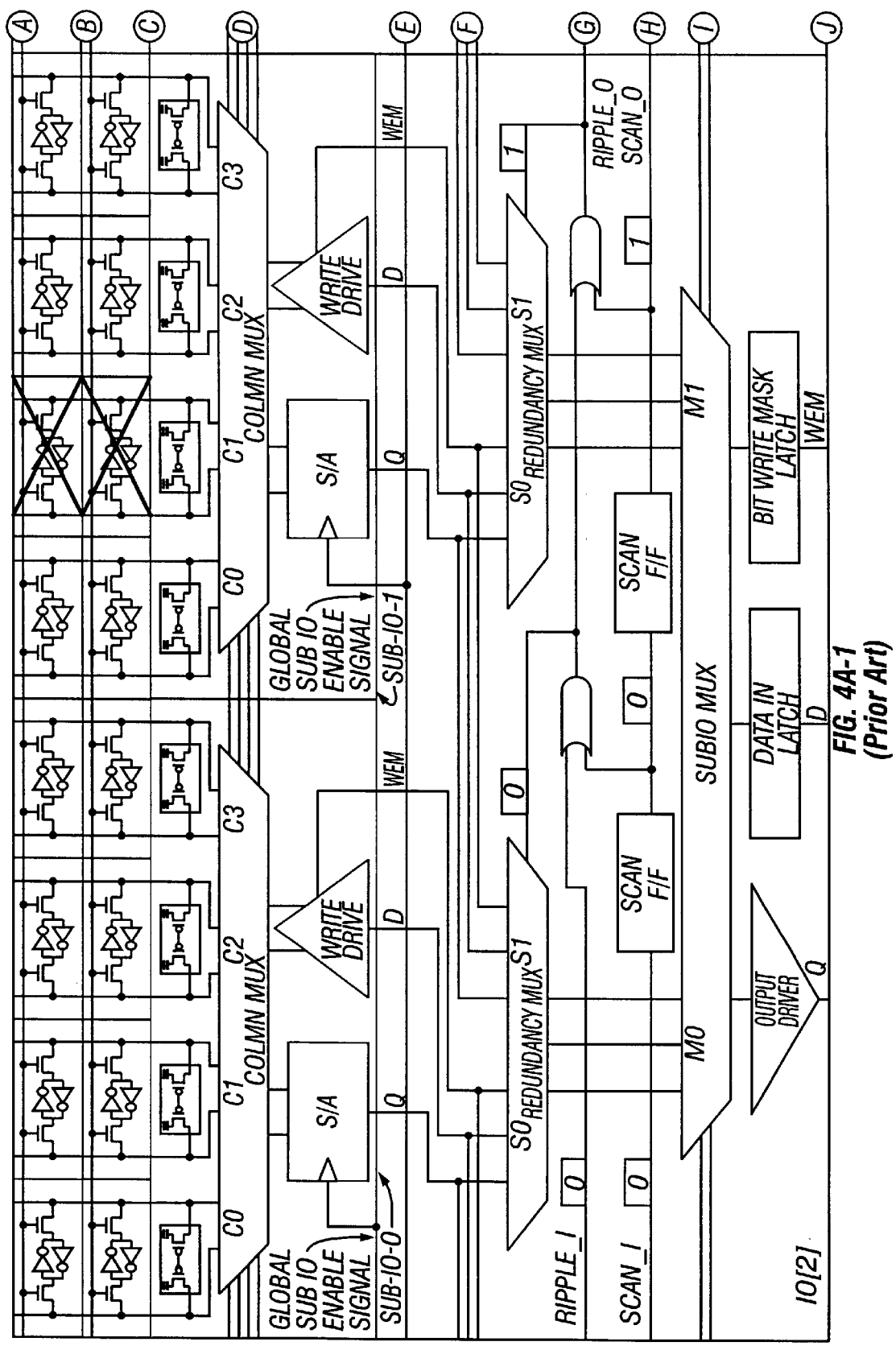
Figures 2, 4A:
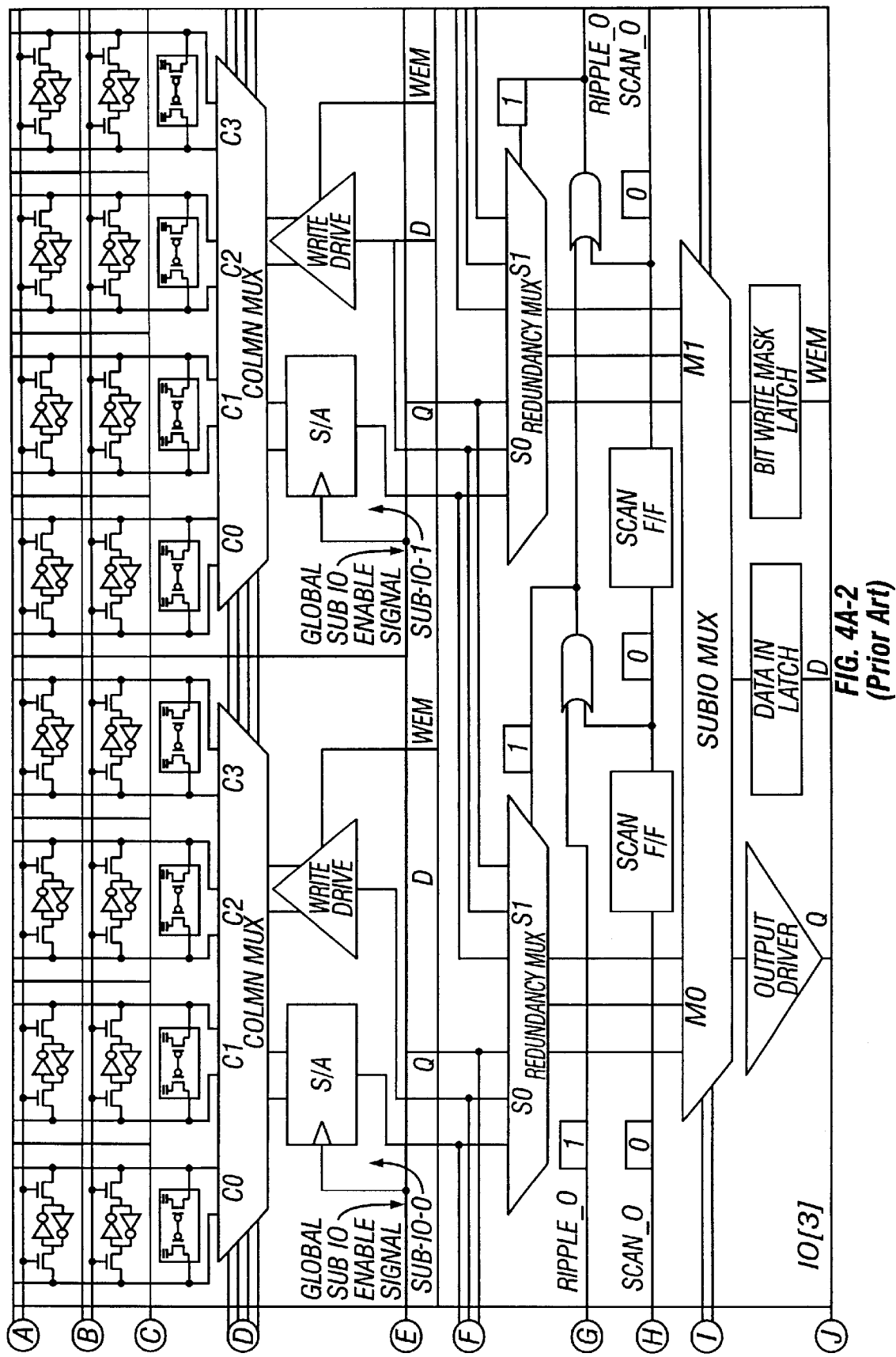
Figures 1, 5A:
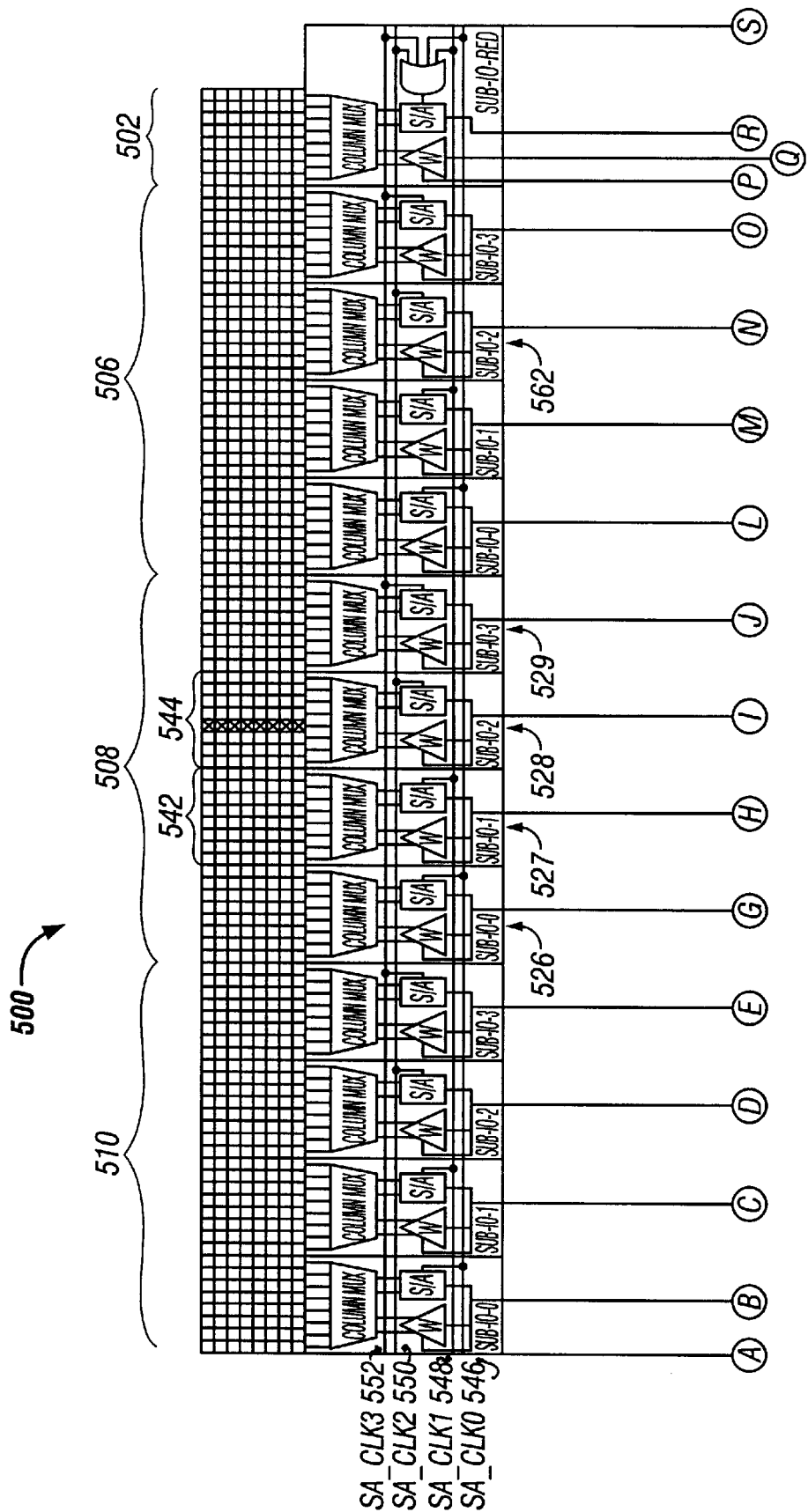
Figures 2, 5A:
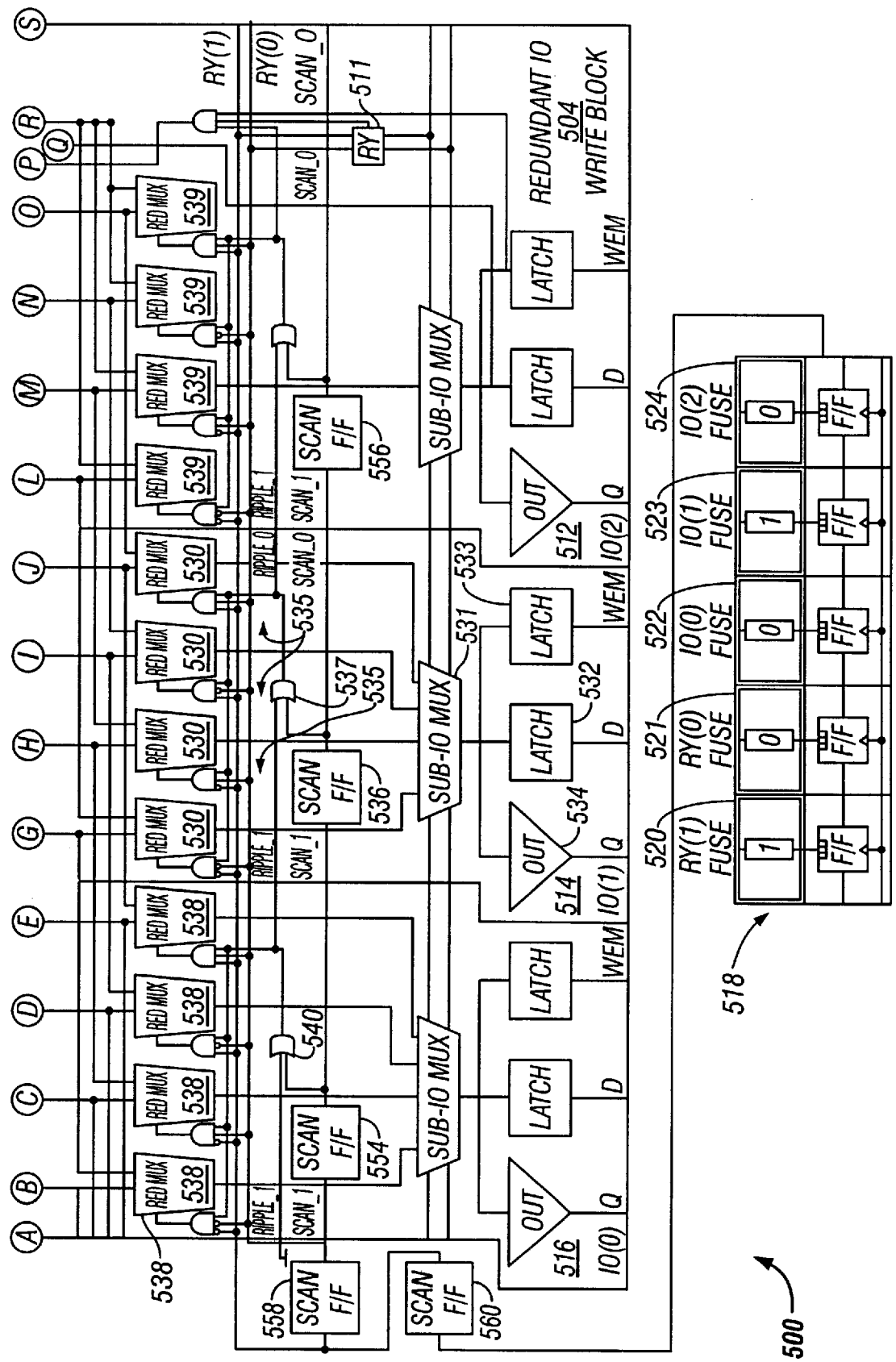

FIGS. 5A-1 and 5A-2 illustrate a block diagram of an embodiment of a group of thirty-two non-redundant memory columns coupled to a non-redundant input-output circuit and a group of eight memory columns coupled to the redundant input-output circuit. Any number of columns may be included in the a given group of non-redundant memory columns, but for purposes of illustration, a memory group having four sets of eight memory columns coupled to each sub input-output circuit contained in an input-output circuit is described. Similarly, any number of columns may be included in the group of redundant memory columns, but for purposes of illustration, a memory group having a set of eight memory columns coupled to the redundant input-output circuit is described.

In an embodiment, a fewer amount of memory columns exist in the group of redundant memory columns than in the group of non-redundant memory columns. As illustrated for an embodiment, eight redundant memory columns 502 couple to the redundant input output circuit 504 and thirty-two non-redundant memory columns 506, 508, 510, couple to each non-redundant input-output circuit 512, 514, 516. In an embodiment of a thirty-two column multiplexing scheme, thirty-two non-redundant memory columns couple to each non-redundant input-output circuit and eight redundant memory columns couple to a redundant input-output circuit.

The memory device 5 contains input-output circuit-0 (IO[0]) 516, input-output circuit-1 (IO[1]) 514, input-output circuit-2 (IO[2]) 512, a redundant input-output 504 and a fuse box 518 containing fuse-RY1 520, fuse-RY0 521, fuse-IO0 522, fuse-IO1 523, and fuse-IO2 524. The memory device 5 also contains a first group of thirty-two non-redundant memory columns 510 coupled to input-output circuit-0 516, a second group of thirty-two non-redundant memory columns 508 coupled to input-output circuit-1 514, a third group of thirty-two non-redundant memory columns 506 coupled to input-output circuit-2 512, and a fourth group of eight redundant memory columns 502 coupled to the redundant input-output circuit 504. In an embodiment, the redundancy logic is located within the memory block containing the groups of non-redundant memory columns 506, 508, 510 and redundant memory columns 502.

The construction and operation of input-output circuit-0 516 through input-output circuit-2 512 is similar, thus, input-output circuit-i 514 will be described to illustrate the concepts embodied. However, concepts developed while describing the structure and operation of input-output circuit-1 514 may be universally applied. In an embodiment, input-output circuit-1 514 may contain two or more sub input-output circuits, such as sub-IO-0 526, sub-IO-1 527, sub-I0-2 528, and sub-IO-3 529. Input-output circuit-1 514 couples through sub-IO-0 526, sub-IO-1 527, sub-IO-2 528, and sub-IO-3 529 to a group of thirty-two non-redundant memory columns 508. In an embodiment, each sub input-output circuit, such as sub-IO-0 526, contains a write driver circuit "W", a sense amplifier "S/A", and a column-multiplexing circuit "COLUMN MUX". Input-output circuit-0 516 may also contain four redundancy multiplexers 530, a sub-IO select multiplexer 531, a data-in-latch 532, a write latch 533, such as a write enable mask (bit write control) latch, a data-out driver 534, and redundancy select circuitry including four AND logic circuits 535, a scan flip-flop 536, and a ripple OR gate 537. In an embodiment, an asynchronous ripple logic is employed. In an embodiment, ripple indicates propagation of a logic value, i.e. the same logic value is propagated down-stream while retaining its logic value on the node which value is propagated. In an embodiment, the ripple logic is asynchronous to the system clock signal.

Input-output circuit-1 514 may have multiple output signals, an output from each sub input-output circuit 526–529 to one or more memory columns 508 coupled to that sub input-output circuit 526–529, an output to each of the four redundancy multiplexers 538 located in the input-output circuit-0 516, an output to each of the four redundancy multiplexers 539 located in input-output circuit-2 512, an output from the ripple OR gate 537 to communicate an activated ripple signal to a downstream input-output circuit, such as input-output circuit-0 516 or input-output circuit-2 512, and an output from the data-out latch 532 to the system data bus (not shown).

Input-output circuit-1 514 may have multiple input signals, an input from each of the one or more memory columns 508 coupled to each sub input-output circuit 526–529, an input from each of the four redundancy multiplexers 539 located in input-output circuit-2 512, an input from each of the four redundancy multiplexers 538 located in input-output circuit-0 516, an input from fuse-IO1 523 to the scan flip flop 536 in order to indicate whether one or more memory columns in the group of non-redundant memory columns 508 coupled to input-output circuit-1 514 are defective, two inputs from scan registers 558, 560 to specify the particular sub input-output circuit 526–529 coupled to one or more defective memory columns 508, an input from a Y-address decoder (not shown) to the sub IO select multiplexer 531 in order to select the appropriate sub input-output circuit 526–529 to perform a data transfer operation, a ripple signal input from an upstream input-output circuit such as ripple OR gate 540, a data input signal to data-in-latch 532 from the system data bus, and a write enable signal to write latch 533.

In an embodiment during write mode, a control signal YM comes from a Y-address decoder (not shown) to direct the sub input-output select multiplexer 531 to select the appropriate sub IO 526–529 in order to perform a data transfer operation. Data-in-latch 532 stores the data input signal from the system data bus until the sub IO select multiplexer 531 receives the control signal from the Y-address decoder. The control signal causes the select multiplexer 531 to call for the data input signal and route the data input signal to the redundancy multiplexing circuit 530 designated by the YM bus from the Y-address decoder.

If no fault exists in any of the non-redundant memory columns 506, 508, 510 coupled to any of the input-output circuits, 512, 514, 516 then the redundancy multiplexing circuit 530 routes the data input signal to the sub IO 526–529 in input output circuit-1 514. For example, redundancy multiplexer-1 541 routes the input data signal to sub-IO-1 527. After sub-IO-1 527 is activated, then sub-IO-1 527 writes the data input signal to one or more of the eight non-redundant memory columns 542 coupled to subIO-1 527.

If a fault exists in any of the non-redundant memory columns 506, 508, 510 coupled to any of the input-output circuits, 512, 514, 516 then the redundancy multiplexer routes the data signal away from the sub IO coupled to the defective memory column over to a sub IO in an adjacent input-output column. For example, a defective memory column exists in the group of eight non-redundant memory columns 544 coupled to sub-IO-2 528 located in input-output circuit-1 514. The redundancy multiplexer 530 receives a control signal through the redundancy select circuitry to route the data input signal away from the group of memory columns 544 containing the defective memory column and over to sub-IO-2 562 located in input-output circuit-2 512. In an embodiment, the substitute sub input output circuit located in the adjacent memory column occupies the same sequence as the sub input-output circuit coupled to the one or more defective memory columns.

In an embodiment, column shift circuitry comprises a scan chain register to receive fault information from a first fuse, a multiplexor, the scan chain register coupled to the multiplexor, a first logical OR gate, the scan chain register coupled to the first logical OR gate, the first logical OR gate to receive an input from a second logical OR gate located in an adjacent input output circuit, and a plurality of logical AND gates, the plurality of logical AND gates to receive an input from the first logical OR gate and the plurality of logical AND gates to receive an input from the scan chain registers 558, 560.

FIGS. 5A-1 and 5A-2 also illustrate an embodiment of a separate sub input-output enable signal to activate a single sub input-output circuit within an input-output circuit rather than globally activating all of the sub input-output circuits within the input-output circuit. In an embodiment, input output circuit-1 514 receives four separate sub input-output enable signals, S/A_CLK0 546, S/A_CLK1 548, S/A_CLK2 550, S/A_CLK3 552. Each sub input output circuit receives its own sub input-output enable signal. For example, sub input-output enable signal, S/A_CLK0 546 is received by sub-IO-0 526. Thus, in an embodiment where four sub input-output circuits exist then four separate sub input-output enable signals exist.

The sub input-output enable signal activates a sub input-output circuit in order to perform a data transfer operation, such as a reading operation. For example, sub-IO-0 526 reads the data contained in the one or more memory columns 544 coupled to sub-IO-0 526, when the sub-IO-0 526 receives S/A$_{13}$CLK0 546. In an embodiment, the sub input-output enable signal is not coupled to any other sub input-output circuit located in the same input-output circuit. Separate sub input-output enable signals allow the memory device to individually activate a particular sub input-output circuit in a given input-output circuit and not globally activate all of the sub input-output circuits in the same input-output circuit. The power consumed during a data transfer operation is reduced by not activating unnecessary sub input-output circuits.

A separate control, the local WEM signal, prevents writes to unselected sub-IOs. The redundancy multiplexors ensure that the local WEM (write enable mask) signals going to unselected sub-IOs remain at a logic low level, thus turning off the write drivers. For correct signal timing, the local WEM signals are combined with a clock similar to the sense enable clock in the write drivers. Where bit write control is not required, the sense enable clock may be substituted for the local WEM signals if signal timing permits. In such a case the separate sense enable clocks prevent write operations in unselected sub-IOs and thereby prevent data corruption.

FIGS. 5A-1 and 5A-2 also illustrate an embodiment of a single fuse per input-output circuit to indicate whether one or more of the memory columns are defective in the group of memory columns coupled to the input-output circuit. For example, fuse-IO1 523, which is associated with memory columns directly coupled to input-output circuit-1 514, contains a logical 1 for bit information. In an embodiment, when the fault indication fuse, fuse-IO1 523, contains a logical 1, then the fault indication fuse is blown. Note, the fault indication fuse, fuse-IO1 523, may contain a logical 1, a logical 0, or any other indicator to indicate that the fuse is blown. The logical 1 in fuse-IO1 523 indicates that one or more of the memory columns are defective in the group of memory columns coupled to the input-output circuit-1 514. The bit information is coupled to the scan flip flop 536 in the redundancy select circuitry. Also illustrated are one or more fuses, such as fuse-RY1 520 and fuse-RY0 521, coupled to scan registers 558, 560 to specify which sub input-output circuit is coupled to one or more defective memory columns. In an embodiment, the total number of fuses included in the plurality of fuses is equal to the number of input-output circuits in the plurality of input output circuits plus the number of fuses used to identify which sub-input-output circuit is coupled to the defective memory column.

During power up or after blowing the fuses, the bit information of each fault indication fuse, such as fuse-1 522, fuse-IO1 523, fuse-IO2 524, transfers to the scan flip flops 536, 554, 556, 558, 560 in a scan chain manner. Fuse-IO0 522 through fuse-IO2 524, each couples to a corresponding input-output circuit 512, 514, 516 to provide a bit value to that input-output circuit 512, 514, 516. For example, fuse-I 522 couples to input-output circuit-0 516. The scan flip-flops 536, 554, 556, 558, 560 can be loaded from a non-volatile fuse box. Note, a blown fuse refers generically to a fuse, which is physically cut, thermally separated, electrically separated, or otherwise changed from the nominal state of the fuse to a second state.

Figures 1, 6A:
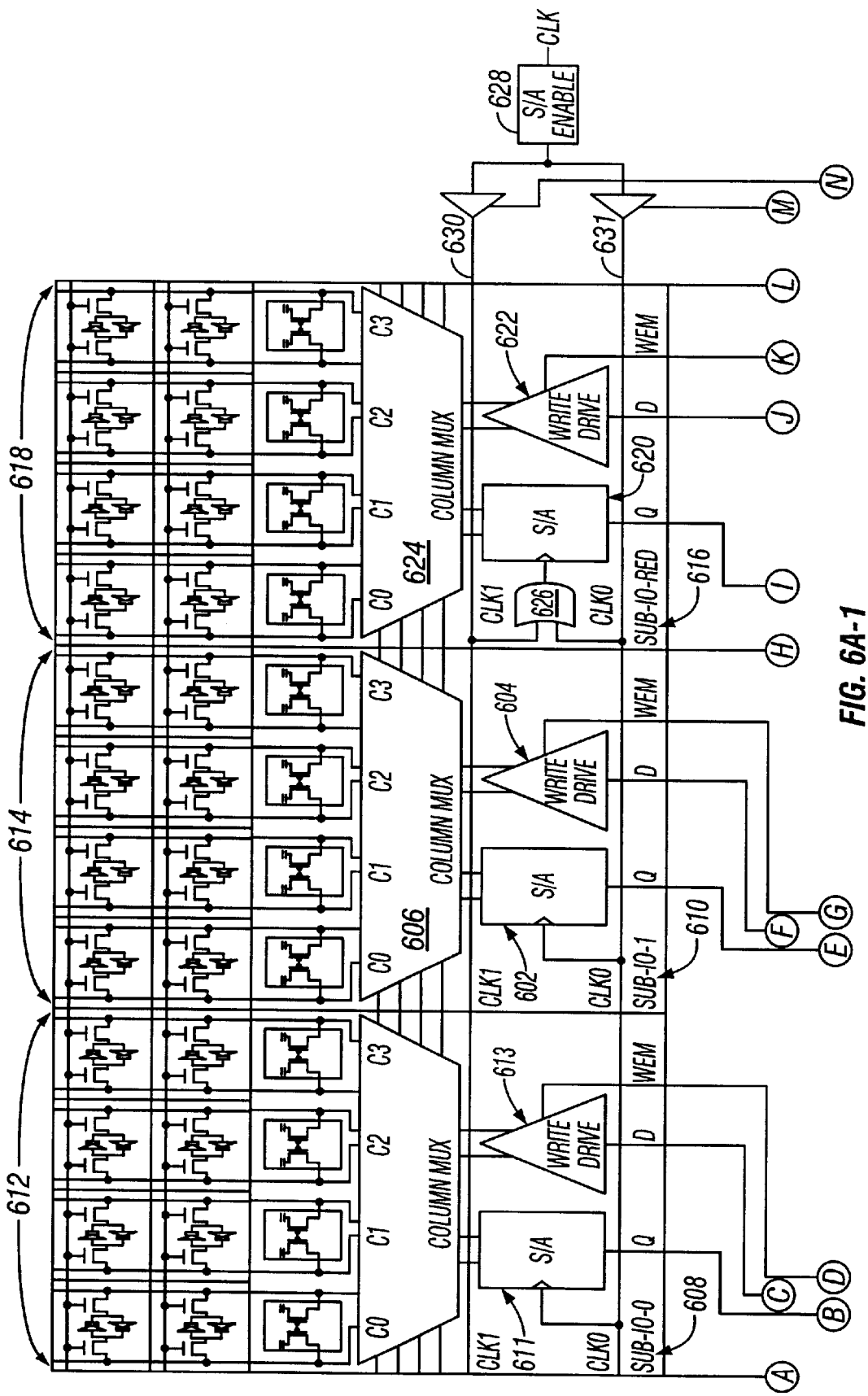
Figures 2, 6A:
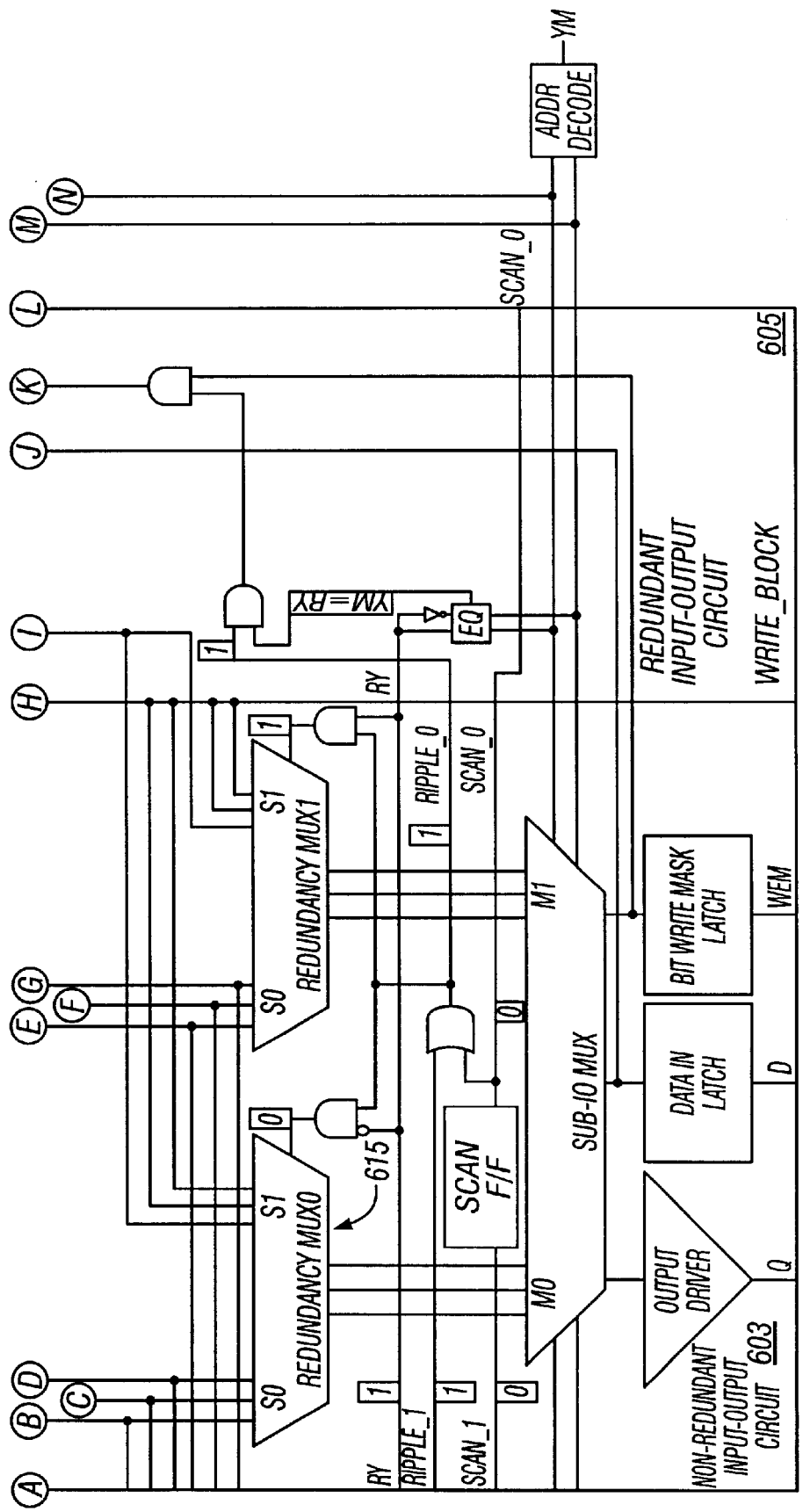

FIGS. 6A-1 and 6A-2 illustrate a block diagram of an embodiment of a separate sub input-output enable signal to activate each sub input-output contained within the same input-output circuit individual and not globally activate all of the sub input-output's circuits contained within the same input-output circuit. As noted above in an embodiment, each sub input-output circuit 608, 610, 616 contains a sense amplifier 602, a write driver 604, and a column-multiplexer 606. As illustrated, the non-redundant input-output circuit 603 contains two sub input-output circuits, sub-IO-0 608 and sub-IO-1 610. Sub-IO-0 608 couples to a first group of four non-redundant memory columns 612. Similarly, sub-IO-1 608 couples to a second group of four non-redundant memory columns 614. The non-redundant input-output circuit 603 is adjacent to the redundant input-out circuit 605. The redundant input-output circuit 605 contains one sub input-output circuit, sub-IO-RED 616. Sub-IO-RED 616 couples to a third group of four redundant memory columns 618. In an embodiment, sub-IO-RED 616 contains a sense amplifier 620, a write driver 622, a column-multiplexer 624, and a logic circuit, such as a logical OR gate 626.

In an embodiment, a sense amplifier enable circuit 628 generates a clock signal to enable a particular sub input-output circuit in order to perform a data transfer operation. In an embodiment, the sense amplifier enable circuit 628 sends a sub-IO enable signal, such as CLK1 630, to the first sense amplifier 602 located in sub-IO-1 610 in order to activate sub-IO-1 610. The sense amplifier enable circuit 628 sends a second sub-IO enable signal, such as CLK0 631, the second sense amplifier 611 located in sub-IO-0 608 in order to activate sub-IO-0 608. Both the first sub-IO enable signal, CLK0 631, and the second sub-IO enable signal, CLK1 630, are received at the inputs of a logical OR gate 626 in sub-IO-RED 616 contained within the redundant input-output circuit 605. Thus, sub-IO-RED 616 activates upon receiving any sub-IO enable signal.

As noted in an embodiment, sub-IO-0 608 activates when the second sense amplifier 611 receives CLK0 631. Sub-IO-0 608 powers up to perform a data transfer operation, such as a reading operation, from the one or non-redundant memory columns in the group of memory columns 612 coupled to sub-IO-0 608. Also, the write driver 613 writes the data input signal from redundancy MUX-0 615 to one or more of the memory columns in the group of memory columns 612 coupled to sub-IO-0 608. However, CLK0 631 is not coupled to sub-IO-1 610, thus, sub-IO-1 610 does not activate and consume unnecessary power when sub-IO-1 610 is not performing any data transfer operations. Similarly, CLK1 630 is not coupled to sub-IO-0 608. Thus, sub-IO-0 608 does not activate when the sense amplifier enable circuit 628 sends CLK1 630 to allow sub-IO-1 610 to perform a data transfer operation. In an embodiment, only the sub input output circuit which is actually performing a data transfer operation activates upon the sense amplifier enable circuit 628 sending a sub-IO enable signal.

However, since sub-IO-RED 616 couples to both CLK0 631 and CLK1 630 then sub-IO-RED 616 can activate upon receiving either CLK0 631 or CLK1 630. This allows sub-IO-RED 616 to substitute for either sub-IO-0 608 or sub-IO-1 610 and perform data transfer operations. In an embodiment, sub-IO-RED 616 replaces either sub-IO-0 608 or sub-IO-1 610 if a fault exists in one or more memory columns in the group of memory columns 612 coupled to sub-IO-0 or if a fault exists in one or more memory columns in the group of memory columns 614 coupled to sub-IO-1 610. In an embodiment, signal timing and event sequence is maintained by a timing circuit.

Figure 7:
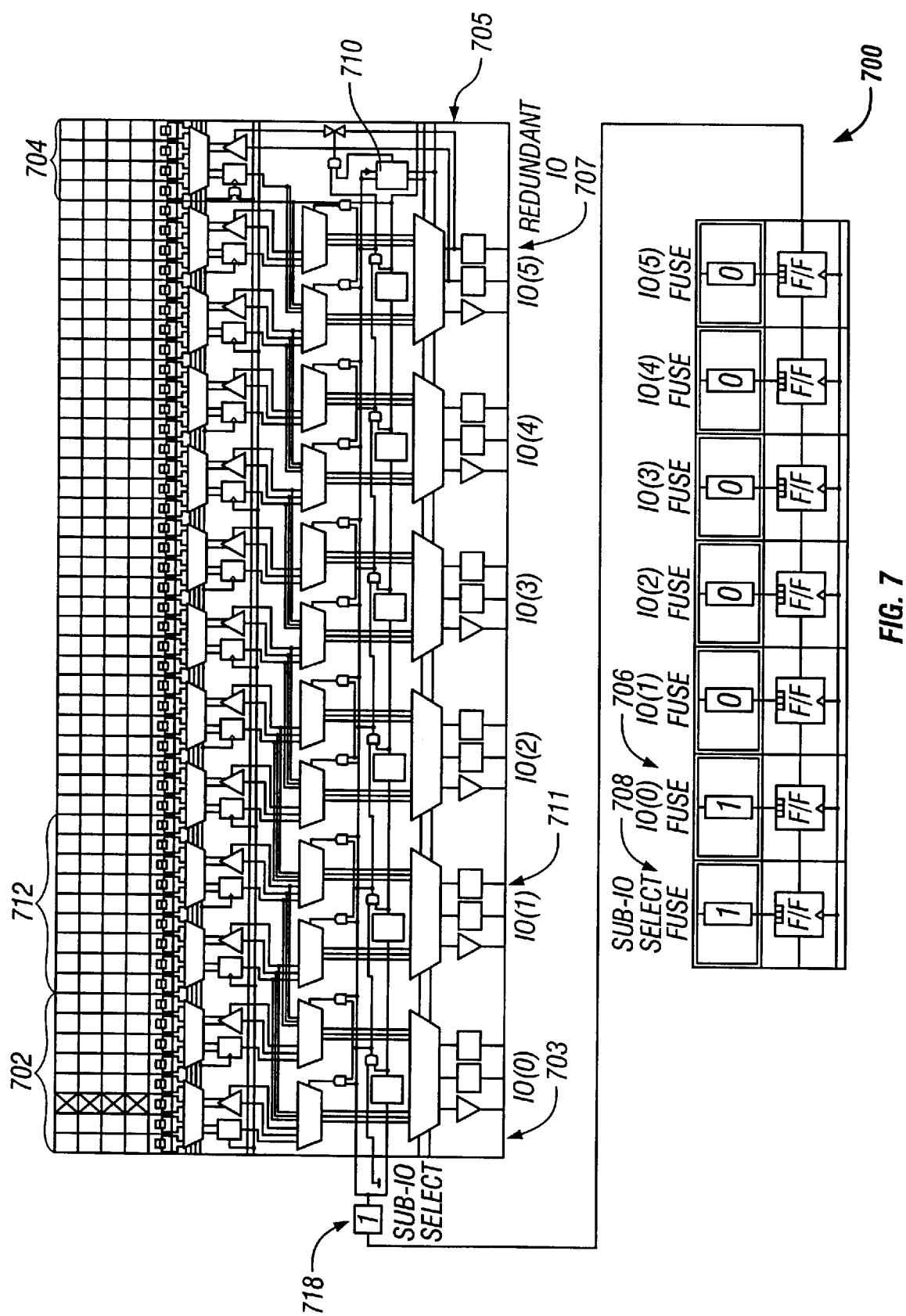
FIG. 7 illustrates a block diagram of an embodiment of having a single fuse exist per input-output circuit and one or more sub-IO-select fuses exist to identify which sub input-output in a particular input-output circuit is coupled to one or more defective memory columns in the group of memory columns coupled to that input-output circuit.

FIG. 7 illustrates a block diagram of an embodiment of having a single fuse per input-output circuit and one or more sub-IO select fuses exist to identify which sub input-output, in a particular input-output circuit, is coupled to one or more defective memory columns in the group of memory columns coupled to that input-output circuit. The memory device 7 contains input-output circuit-0 703 through input-output circuit-5 707. A discrete group of eight memory columns couple to each non-redundant input-output. For example, a first group of eight memory columns 702 couples to input-output-circuit-0 703. A second group of eight memory columns 712 couples to input-output-circuit-1 711. Fault indication fuse, fuse-1 706, couples to input-output circuit-0 703 to indicate that one or more memory columns in the group of memory columns 702 coupled to input-output circuit-0 703 are defective. The sub-input-output circuit-select fuse, fuse-sub-IO-select 708, couples to the redundancy select scan register 718 in order to indicate which sub input-output circuit contained in input-output circuit-0 703 is coupled to one or more defective memory columns. A redundant sub-IO select block 710 activates the redundant sub-IO when the Y-address for a sub-IO located in a non-redundant input-output circuit is selected for a data transfer operation.

FIG. 7 also illustrates a fewer amount of memory columns exist in the group of redundant memory columns 704 than in the group of non-redundant memory columns 702. As noted above, a first group of eight memory columns 702 couples to input-output-circuit-0 703. A third group of four memory columns 704 couples to the redundant input-output circuit 705. Thus, a fewer amount of memory columns exist in the group of four redundant memory columns 704 than in the group of eight non-redundant memory columns 702.

Figure 8:
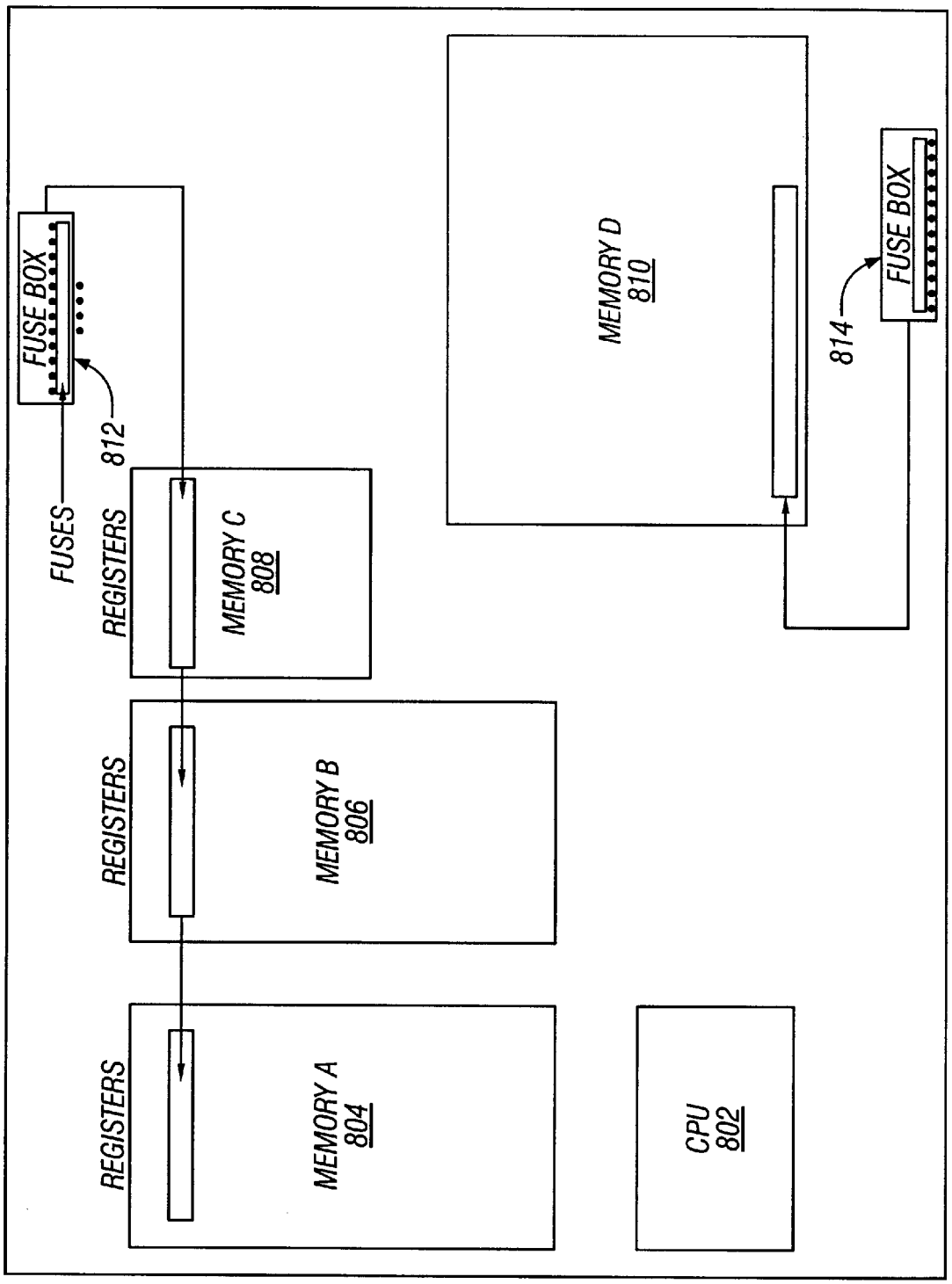
FIG. 8 illustrates a block diagram of an embodiment of a processor system containing multiple memory instances having a single fuse per input-output circuit and one or more sub-IO-select fuses to identify which sub input-output in a particular input-output circuit is coupled to one or more defective memory columns.

FIG. 8 illustrates a block diagram of an embodiment of a processor system containing multiple memory instances having a single fuse per input-output circuit and one or more sub-IO select fuses to identify which sub input-output in a particular input-output circuit is coupled to one or more defective memory columns. In an embodiment, the memory instances have a separate sub input-output enable signal to activate each sub input-output contained within the same input-output circuit individual and not globally activate all of the sub input-output's circuits contained within the same input-output circuit. In an embodiment, the memory instances have a different amount of memory columns in the group of redundant memory columns than in the group of non-redundant memory columns.

The processor system has a central processing unit 802 four memory arrays, memory-A 804, memory-B 806, memory-C 808, and memory-D 810, as well as two fuse boxes, fuse box-1 812 and fuse box-2 814. The memory arrays 804–810 have a memory column redundancy structure. Fuse box-1 812 and fuse box-2 814 contain fuses. The fuses store address information corresponding to one or more memory columns containing a faulty cell and to identify the sub input-output circuit coupled to those one or more defective memory columns. The memory arrays 804–810 also contain column shift circuitry to shift data transfer operations a plurality of the input-output circuits away from a sub IO coupled to one or more defective memory columns over to a substitute sub IO upon detecting the one or more defective memory columns. The CPU 802 reads and writes data to the memory columns in the memory arrays 804–810 through the input-output circuits contained in each memory array.

Figure 9:
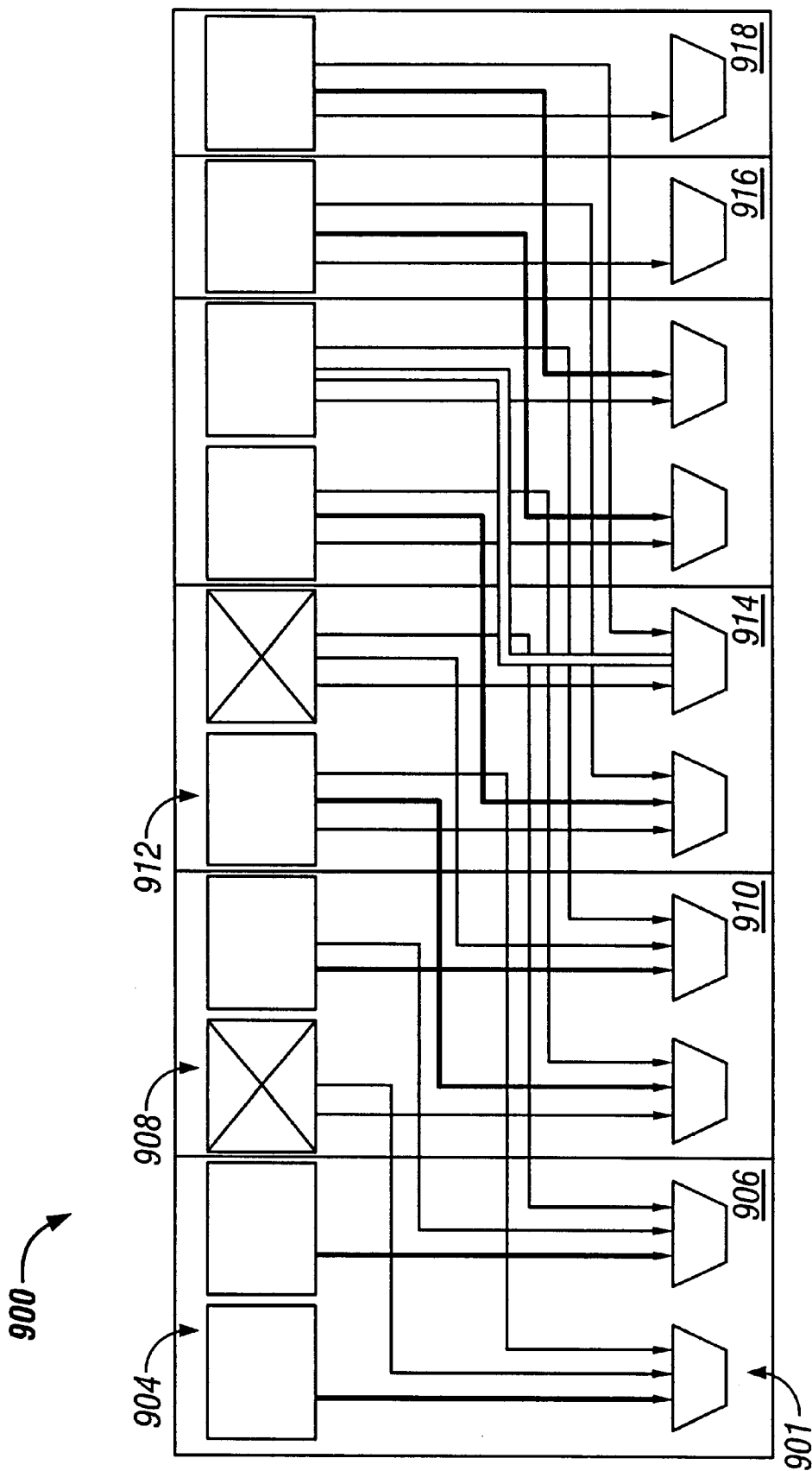
FIG. 9 illustrates a block diagram of an embodiment of a memory device having multiple redundant input-output circuits.

FIG. 9 illustrates a block diagram of an embodiment of a memory device having multiple redundant input-output circuits. In an embodiment, a redundancy multiplexor, such as redundancy multiplexor-1 901, is 3-way multiplexor Redundancy multiplexor will be used as an example however, other redundant multiplexors operate similarly. The first input of the redundancy multiplexor couples to an associated sub-input-output circuit, such as sub-input-output circuit-1 904, contained within the first input-output circuit 906. The second input of the redundancy multiplexor-1 901 couples to a second sub-input-output circuit 908 contained within the adjacent input-output circuit, such as the second input-output circuit 910. The third input of the redundancy multiplexor-1 901 couples to a third sub-input-output circuit 912 contained within a third input-output circuit 914. In an embodiment, the memory device 9 contains a second set of sub-IO select fuses (not shown) and their corresponding scan registers (not shown) and global sub-input-output redundancy select lines RY (not shown). In an embodiment, a second ripple logic chain (not shown) exists to support the multiple redundant input-output circuits, such as a redundant input-output circuit-1 916 and redundant input-output circuit-2 918. In an embodiment, decoders (not shown), such as AND logic gates, decode the inputs from the ripple logic and the redundancy select lines.

While some specific embodiments of the invention have been shown the invention is not to be limited to these embodiments. For example, most functions performed by electronic hardware components may be duplicated by software emulation. Thus, a software program written to accomplish those same functions may emulate the funtionality of the hardware components in input-output circuitry. One skilled in the art will understand that multiple embodiments of the various circuits described herein may be contructed from logic circuritry, such as AND gates, NAND gates, Exclusive OR gates, Inverters, etc., to accomplish the same concepts. The invention is to be understood as not limited by the specfic embodiment herein, but only by scope of the appended claims.

What is claimed is:

1. A method, comprising:

coupling a first group of redundant memory columns to a first redundant input-output circuit;

coupling a second group of non-redundant memory columns to a second non-redundant input-output circuit, a fewer amount of memory columns exist in the first group of redundant memory columns than in the second group of non-redundant memory columns;

coupling a first fuse to a non-redundant input-output circuit, the first fuse to indicate whether one or more memory columns are defective in a group of non-redundant memory columns coupled to the non-redundant input-output circuit;

coupling a second fuse to a first circuit, the first circuit to identify which sub-input-output circuit in the non-redundant input-output circuit is coupled to the one or more defective memory columns;

performing a data transfer operation with a first sub input-output circuit in an input-output circuit, the input-output circuit containing a plurality of sub input-output circuits that each receives a separate activation signal; and activating the first sub input-output circuit to perform the data transfer operation without globally activating the plurality of sub input-output circuits contained within the input-output circuit.

2. An apparatus, comprising:

means for coupling a first group of redundant memory columns to a first redundant input-output circuit;

means for coupling a second group of non-redundant memory columns to a second non-redundant input-output circuit, a fewer amount of memory columns exist in the first group of redundant memory columns than in the second group of non-redundant memory columns;

means for coupling a first fuse to a non-redundant input-output circuit, the first fuse to indicate whether one or more memory columns are defective in a group of non-redundant memory columns coupled to the non-redundant input-output circuit;

means for coupling a second fuse to a first circuit, the first circuit to identify which sub-input-output circuit in the non-redundant input-output circuit is coupled to the one or more defective memory columns;

means for performing a data transfer operation with a first sub input-output circuit in an input-output circuit, the input-output circuit containing a plurality of sub input-output circuits that each receives a separate activation signal; and means for activating the first sub input-output circuit to perform the data transfer operation without globally activating the plurality of sub input-output circuits contained within the input-output circuit.

3. A method, comprising:

performing a data transfer operation with a first sub input-output circuit contained within an input-output circuit, sending a separate activation signal to at least two or more sub input-output circuits in the input-output circuit; and activating the first sub input-output circuit to perform the data transfer operation without globally activating the two or more sub input-output circuits.

4. The method of claim 3, further comprising:

coupling a first fuse to a non-redundant input-output circuit, the first fuse to indicate whether one or more memory columns are defective in a group of non-redundant memory columns coupled to the non-redundant; and coupling a second fuse to a first circuit, the first circuit to identify which sub-input-output circuit is coupled to the one or more defective memory columns.

5. The method of claim 3, wherein the first input-output circuit comprises a first non-redundant input-output circuit.

6. The method of claim 5, further comprising:

coupling a first group of non-redundant memory columns to the first non-redundant input-output circuit; and coupling a second group of redundant memory columns to a second redundant input-output circuit, a fewer amount of memory columns exist in the second group of redundant memory columns than in the first group of non-redundant memory columns.

7. An apparatus, comprising:

means for performing a data transfer operation with a first sub input-output circuit contained within an input-output circuit, means for sending a separate activation signal to at least two or more sub input-output circuits in the input-output circuit; and means for activating the first sub input-output circuit to perform the data transfer operation without globally activating the two or more sub input-output circuits.

8. The apparatus of claim 7, further comprising:

means for coupling a first fuse to a non-redundant input-output circuit, the first fuse to indicate whether one or more memory columns are defective in a group of non-redundant memory columns coupled to the non-redundant; and means for coupling a second fuse to a first circuit, the first circuit to identify which sub-input-output circuit is coupled to the one or more defective memory columns.

9. The method of claim 7, wherein the first input-output circuit comprises a first non-redundant input-output circuit.

10. The apparatus of claim 9, further comprising:

means for coupling a first group of non-redundant memory columns to the first non-redundant input-output circuit; and means for coupling a second group of redundant memory columns to a second redundant input-output circuit, a fewer amount of memory columns exist in the second group of redundant memory columns than in the first group of non-redundant memory columns.

11. A method, comprising:

indicating with a first fuse whether one or more memory columns are defective in a first group of non-redundant memory columns coupled to a first non-redundant input-output circuit, the first non-redundant input-output circuit is associated with a plurality of sub input-output circuits; and identifying a particular sub-input-output circuit that is coupled to the one or more memory columns that are defective by using a second fuse;

shifting a data operation from a first sub input-output circuit coupled to one or more defective memory columns over to a second sub input-output circuit located in an adjacent input-output circuit.

12. The method of claim 11, further comprising:

performing a data transfer operation with a third sub input-output circuit included in the plurality of sub input-output circuits that each receives a separate activation signal; and activating the third sub input-output circuit to perform the data transfer operation without globally activating the plurality of sub input-output circuits contained within the first non-redundant input-output circuit.

13. The method of claim 11, further comprising:

coupling a second group of non-redundant memory columns to a second non-redundant input-output circuit, a fewer amount of memory columns exist in the first group of redundant memory columns than in the second group of non-redundant memory columns.

14. An apparatus, comprising:

means for indicating with a first fuse whether one or more memory columns are defective in a first group of non-redundant memory columns coupled to a first non-redundant input-output circuit, the first non-redundant input-output circuit is associated with a plurality of sub input-output circuits; and means for identifying a particular sub-input-output circuit that is coupled to the one or more memory columns that are defective by using a second fuse;

means for shifting a data operation from a first sub input-output circuit coupled to one or more defective memory columns over to a second sub input-output circuit located in an adjacent input-output circuit.

15. The apparatus of claim 14, further comprising:

means for performing a data transfer operation with a third sub input-output circuit included in the plurality of sub input-output circuits that each receives a separate activation signal; and means for activating the third sub input-output circuit to perform the data transfer operation without globally activating the plurality of sub input-output circuits contained within the first non-redundant input-output circuit.

16. The apparatus of claim 14, further comprising:

means for coupling a second group of non-redundant memory columns to a second non-redundant input-output circuit, a fewer amount of memory columns exist in the first group of redundant memory columns than in the second group of non-redundant memory columns.

\* \* \* \* \*